US008193565B2

(12) United States Patent
Yang et al.

(10) Patent No.: US 8,193,565 B2
(45) Date of Patent: Jun. 5, 2012

(54) MULTI-LEVEL LATERAL FLOATING COUPLED CAPACITOR TRANSISTOR STRUCTURES

(75) Inventors: Robert Kuo-Chang Yang, Campbell, CA (US); Muhammed Ayman Shibib, San Jose, CA (US); Richard A. Blanchard, Los Altos, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 266 days.

(21) Appl. No.: 12/426,004

(22) Filed: Apr. 17, 2009

(65) Prior Publication Data

US 2010/0123171 A1    May 20, 2010

Related U.S. Application Data

(60) Provisional application No. 61/124,744, filed on Apr. 18, 2008, provisional application No. 61/124,786, filed on Apr. 18, 2008, provisional application No. 61/124,730, filed on Apr. 18, 2008, provisional application No. 61/124,683, filed on Apr. 18, 2008, provisional application No. 61/124,736, filed on Apr. 18, 2008.

(51) Int. Cl.
*H01L 29/66* (2006.01)

(52) U.S. Cl. . 257/272; 257/342; 257/339; 257/E27.092; 257/E27.016

(58) Field of Classification Search .................. 257/401, 257/495, E29.338, E29.342, E29.318, E29.262, 257/272, E27.016, 213, 339, 342, E27.092
See application file for complete search history.

(56) References Cited

U.S. PATENT DOCUMENTS

| 5,075,739 | A | 12/1991 | Davies |
| 5,111,254 | A | 5/1992 | Levinson et al. |
| 5,204,545 | A | 4/1993 | Terashima |
| 5,334,546 | A | 8/1994 | Terashima |
| 6,037,632 | A | 3/2000 | Omura et al. |
| 6,110,804 | A | 8/2000 | Parthasarathy et al. |
| 6,190,948 | B1 | 2/2001 | Seok |
| 6,310,378 | B1 | 10/2001 | Letavic et al. |
| 6,353,252 | B1 | 3/2002 | Yasuhara et al. |
| 6,576,973 | B2 | 6/2003 | Collard et al. |

(Continued)

FOREIGN PATENT DOCUMENTS

EP    20164 A1    12/1990

(Continued)

OTHER PUBLICATIONS

Chen et al. "Optimization of the specific on-resistance of the COOLMOSTM," IEEE Transactions on Electron Devices 48:344-348 (Feb. 2001).

*Primary Examiner* — Caridad Everhart
(74) *Attorney, Agent, or Firm* — Kilpatrick Townsend & Stockton LLP

(57) ABSTRACT

A semiconductor device includes a source region, a drain region, a gate region, and a drift region. The drift region further includes an active drift region and inactive floating charge control (FCC) regions. The active drift region conducts current between the source region and the drain region when voltage is applied to the gate region. The inactive FCC regions, which field-shape the active drift region to improve breakdown voltage, are vertically stacked in the drift region and are separated by the active drift region. Vertically stacking the inactive FCC regions reduce on-resistance while maintaining higher breakdown voltages.

22 Claims, 16 Drawing Sheets

U.S. PATENT DOCUMENTS

| | | |
|---|---|---|
| 6,590,240 B1 | 7/2003 | Lanois |
| 6,717,230 B2 | 4/2004 | Kocon |
| 6,750,506 B2 | 6/2004 | Noda et al. |
| 6,873,011 B1 | 3/2005 | Huang et al. |
| 6,879,005 B2 | 4/2005 | Yamaguchi et al. |
| 6,897,133 B2 | 5/2005 | Collard |
| 6,903,413 B2 | 6/2005 | Lanois |
| 6,903,421 B1 | 6/2005 | Huang et al. |
| 6,989,566 B2 | 1/2006 | Noda et al. |
| 6,995,428 B2 | 2/2006 | Huang et al. |
| 7,033,891 B2 | 4/2006 | Wilson et al. |
| 7,078,783 B2 | 7/2006 | Lanois |
| 7,101,739 B2 | 9/2006 | Lanois |
| 7,208,385 B2 | 4/2007 | Hossain et al. |
| 7,282,765 B2 | 10/2007 | Xu et al. |
| 7,535,057 B2 | 5/2009 | Yang |
| 2002/0105007 A1 | 8/2002 | Saggio et al. |
| 2002/0130358 A1 | 9/2002 | Van Dalen et al. |
| 2003/0232477 A1* | 12/2003 | Deboy et al. ............ 438/305 |
| 2004/0164304 A1 | 8/2004 | Magri et al. |
| 2005/0127434 A1 | 6/2005 | Quoirin et al. |
| 2005/0133858 A1 | 6/2005 | Banejee et al. |
| 2005/0136613 A1 | 6/2005 | Poveda |
| 2006/0118833 A1 | 6/2006 | Lanais |
| 2006/0138450 A1 | 6/2006 | Lanois et al. |
| 2006/0157745 A1 | 7/2006 | Lanois |
| 2006/0205196 A1 | 9/2006 | Lanois |
| 2006/0255401 A1 | 11/2006 | Yang et al. |
| 2006/0267044 A1 | 11/2006 | Yang |
| 2007/0052060 A1 | 3/2007 | Yang |
| 2007/0102725 A1 | 5/2007 | Magri' et al. |
| 2007/0176229 A1* | 8/2007 | Willmeroth et al. .......... 257/328 |
| 2007/0187781 A1 | 8/2007 | Kocon |
| 2007/0262398 A1* | 11/2007 | Darwish et al. ............... 257/409 |

FOREIGN PATENT DOCUMENTS

| | | |
|---|---|---|
| EP | 1073123 A2 | 1/2001 |
| EP | 1111683 A2 | 6/2001 |
| JP | 62-173764 A | 7/1987 |
| JP | 63-296282 A | 12/1988 |
| JP | 09-181109 A | 7/1997 |
| JP | 2001-237423 A | 8/2001 |
| JP | 2002-299622 A | 10/2002 |
| WO | WO01/59846 A1 | 8/2001 |

* cited by examiner

SOURCE 105  N+ REGION 130  DRIFT REGION 135  DRAIN 115
GATE 110

N2>N1

//MULTI-LEVEL LATERAL FLOATING COUPLED CAPACITOR TRANSISTOR STRUCTURES

CROSS-REFERENCE TO RELATED APPLICATIONS

This application claims the benefit of U.S. Provisional Application No. 61/124,744, filed Apr. 18, 2008, U.S. Provisional Application No. 61/124,786, filed Apr. 18, 2008, U.S. Provisional Application No. 61/124,730, filed Apr. 18, 2008, U.S. Provisional Application No. 61/124,683, filed Apr. 18, 2008, and U.S. Provisional Application No. 61/124,736, filed Apr. 18, 2008, all of which are incorporated herein by reference in their entireties.

BACKGROUND OF THE INVENTION

In semiconductor devices, including high voltage devices, it is desirable to obtain a low on-resistance that is primarily determined by the drift region resistance. Typically, the drift region resistance of a transistor is lowered by increasing the doping level of the drift region. However, increasing the doping level of the drift region has the undesirable effect of reducing the breakdown voltage. The doping level of the drift region is therefore optimized to obtain the maximum on-resistance while still maintaining a sufficiently high breakdown voltage. As the requirements for breakdown voltages increase, the use of drift region doping concentrations to adjust on-resistance and breakdown voltages becomes more difficult.

In addition to breakdown voltages being affected by the doping concentration of the drift region, breakdown voltages are also affected by the electric field distribution inside and outside the device. As a result, there have been efforts in the art to control the electric field distribution by field-shaping methods and therefore control the on-resistance and breakdown voltage of transistor devices. For example, lateral floating coupled capacitor (FCC) structures have been used to control the electric fields in the drift region of a transistor and thereby improve on-resistance. These FCC structures include insulated trenches formed in the drift region of a transistor, which contain isolated electrodes and are parallel to the direction of current flow. These FCC structures improve transistor properties. For example, the drift region field-shaping provided by the FCC regions can desirably provide high breakdown voltage and low on-resistance simultaneously. However, there are problems associated with using FCCs to control the breakdown voltage and on-resistance including using a substantial portion of the drift region for the FCC structure, which can reduce the amount of current flow and also effect on-resistance.

Therefore, there is need for semiconductor devices that have improved on-resistance while maintaining higher breakdown voltages.

BRIEF SUMMARY OF THE INVENTION

Embodiments of the present invention provide field effect transistors with lateral floating control capacitors that reduce on-resistance while maintaining higher breakdown voltages.

According to an embodiment, a semiconductor device includes a source region, a drain region, a gate region, and a drift region. The drift region further includes an active drift region and inactive floating charge control (FCC) regions. The active drift region conducts current between the source region and the drain region when voltage is applied to the gate region. The inactive floating charge control (FCC) regions, which field-shape the active drift region to improve breakdown voltage, are vertically stacked in the drift region and are separated by the active drift region.

In another embodiment, the inactive FCC regions further include floating field-shaping conductors that spread an applied voltage substantially evenly across a length of the drift region.

In yet another embodiment, the inactive FCC regions further include a single field-shaping conductor per trench made with polysilicon surrounded by an oxide layer.

In yet another embodiment, the inactive FCC regions further include more than one field-shaping conductor per trench. The field-shaping conductors can be made with polysilicon that are surrounded by an oxide layer.

In yet another embodiment, the field-shaping conductor forms an equipotential around the width of the drift region from source to drain at each of the laterally spaced FCC regions.

In yet another embodiment, the drift region further includes additional inactive FCC regions, which are vertically stacked in the drift region and are separated by the active drift region forming a mesh structure. The mesh structure separates an array of drift region current conduction paths.

According to another embodiment, a semiconductor device includes a source region, a drain region, a gate region, and a drift region. The drift region further includes an active drift region and inactive FCC regions. The active drift region conducts current between the source region and the drain region when voltage is applied to the gate region. The inactive FCC regions field-shape the active drift region to improve breakdown voltage. The active drift region can have a heavily doped portion that is closest to the gate region. The heavily doped portion that is closest to the gate can be divided into segments roughly aligned with the inactive FCC regions and also overlapping laterally with the active drift region.

According to another embodiment, a semiconductor device includes a source, a drain, a gate, a drift region disposed between the gate and the drain which provides a conduction path between the source and the drain, a first floating coupled capacitor (FCC) and a second FCC disposed in the drift region between the gate and the drain. A portion of the drift region between the first FCC and the second FCC includes at least one pn junction.

In yet another embodiment, the at least one pn junction is a vertical pn junction.

In yet another embodiment, the at least one pn junction increases a carrier concentration in the drift region by about a factor of two.

In yet another embodiment, the at least one pn junction substantially reduces the on-resistance of the semiconductor device.

According to another embodiment, a semiconductor device includes a source, a drain, a gate, a drift region and floating coupled capacitors (FCC). The drift region, which is disposed between the source and the drain, provides a conduction path between the source and the drain. The floating coupled capacitors (FCC), which are formed in floating trench regions, are disposed in the drift region between the source and the drain. The floating trench regions are separated from each other by widths of separation regions. The doping concentration and the width of the separation region are inversely proportional.

According to another embodiment, a semiconductor device includes a source, a drain, a gate, drift regions and floating coupled capacitors (FCC). The drift region has different doping concentrations disposed between the source and the drain. The floating coupled capacitors (FCC), which are formed in floating trench regions, separate the drift regions by respective widths. The doping concentration and the respective width of the separation region are inversely proportional.

In yet another embodiment, the drift regions having different doping concentrations include a lightest doped region that is closest to the source.

In yet another embodiment, the drift regions having different doping concentrations includes a highest doped region that is closest to the drain.

In yet another embodiment, the drift regions having different doping concentrations include a lightest doped region that is closest to the source, and a highest doped region that is closest to the drain.

In yet another embodiment, the drift regions having different doping concentrations are disposed according to doping concentration. Lighter doped regions are disposed closest to the source and a highest doped region that is closest to the drain.

In yet another embodiment, the floating trench regions have varying depths.

In yet another embodiment, the floating trench regions have varying widths.

In yet another embodiment, the plurality of floating trench regions are substantially the same shape.

In yet another embodiment, the semiconductor device includes a termination region having regions of different doping concentrations wherein the doping concentrations of the termination region are lower than the doping concentrations in the drift region. The termination region can further include termination floating trench regions that are wider than the floating trench regions disposed in the plurality of drift regions.

According to another embodiment, a semiconductor device includes an active region having a first floating charge control structure, and a termination region having a second floating control structure. The second floating control structure is at least twice as long as the first floating control structure.

In yet another embodiment, the first floating charge control structure and the second floating charge control structure are substantially parallel to each other.

In yet another embodiment, the first floating charge control structure and the second floating charge control structure are substantially perpendicular to each other.

In yet another embodiment, the first floating charge control structure and the second floating charge control structure are substantially parallel.

In yet another embodiment, the first floating charge control structure and the second floating charge control structure are substantially the same width.

In yet another embodiment, the first floating charge control structure and the second floating charge control structure have different widths.

In yet another embodiment, the first floating charge control structure is about twice as wide as the second floating charge control structure.

In yet another embodiment, the second floating charge control structure overlaps with a drift region of a drain in the active region.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

A further understanding of the nature and advantages of the invention may be realized by reference to the remaining portions of the specification and the drawings, presented below. The Figures are incorporated into the detailed description portion of the invention.

DETAILED DESCRIPTION OF THE INVENTION

In the following description, for the purposes of explanation, specific details are set forth in order to provide a thorough understanding of the invention. However, it will be apparent that the invention may be practiced without these specific details.

Embodiments of the present invention provide field effect transistors with lateral floating control capacitors that reduce on-resistance while maintaining higher breakdown voltages. In embodiments, the drift region of a field effect transistor includes an active drift region that conducts current between the source region and the drain region when voltage is applied to the gate region and inactive floating charge control (FCC) regions that field-shape the active drift region to improve breakdown voltage. The inactive FCC regions are vertically stacked in the drift region and are separated by the active drift region. The active drift region can also have a heavily doped portion that is closest to the gate region, and the heavily doped portion that is closest to the gate can be divided into segments roughly aligned with the inactive FCC regions and also overlapping laterally with the active drift region. The active drift region can also have at least one pn junction disposed between a first FCC and a second FCC. The drift regions can have a doping concentration that is inversely proportional to the shield shaping conductor separation distances. The FCC regions can be located in trenches that are disposed in the termination region as well as the active region. The trenches, which contain the FCC regions, can be disposed so that the trenches in the termination region are either parallel or perpendicular to the trenches in the action region. Details of these embodiments are explained below with reference to the figures.

Figure 1A:
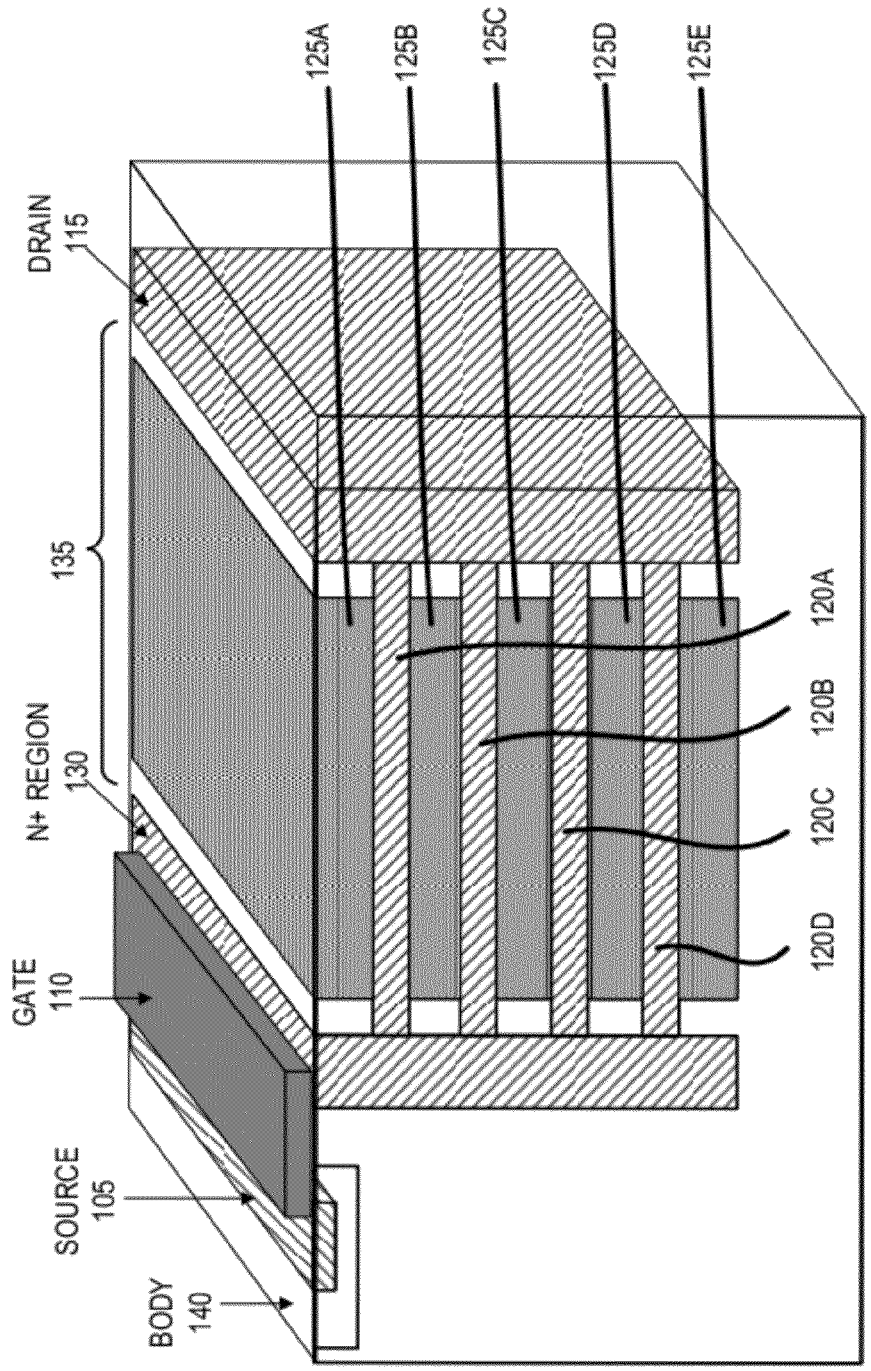
FIG. 1A is an illustration of a semiconductor device that can incorporate an embodiment of the invention.

FIG. 1A is an illustration of a field effect transistor (FET) that uses floating coupled capacitor (FCC) in the drift region to improve the FET's on-resistance. The FET includes a source 105, a gate 110, a drain 115, active drift regions (four shown) 120A-120D, inactive FCC regions (five shown) 125A-125E, an N+ buffer region 130, and a body 140. The active drift regions 120A-120D and the inactive FCC regions 125A-125E, which are configured laterally between the source 105, gate 110 and drain 115, make up the drift region 135. The active drift regions 120A-120D can be made of n+ material or p+ material that can serve as a conductive region for current flow. The inactive FCC regions 125A-125E are the field-shaping regions, which control electric fields in the active drift region and therefore effect the on-resistance and breakdown voltage of the device. The inactive FCC regions 125A-125E include field-shaping conductors surrounded by insulating material. The field-shaping conductors can be polysilicon and the insulating materials can be oxides. The electric field distribution in the active drift region can also be made more uniform by embedding one or more field-shaping regions in the drift region. The field-shaping regions include field-shaping conductors. The increased field uniformity can increase breakdown voltage. The FCC regions can also be used to cause the depletion of the active drift region. If the active drift region is not depleted, then a low breakdown voltage can result. During reverse bias operation, it is desirable that the multiple depletion regions in the silicon resulting from the multiple inactive FCC regions 125A-125E merge into a single depletion region. The N+ buffer region 130 is made of a conductive material that makes electrical contact between the active drift regions 120A-120D and a channel formed under the gate 110. The source 105 is disposed in the body 140, which can be a conductor. When sufficient voltage is applied to the gate 110 a channel forms under the gate 110, and current flows from the source 105 through the channel to the N+ buffer region 130 to the active drift regions 120A-120D and to the drain 115.

The separation between the field-shaping conductors in the inactive FCC regions 125A-125E is selected to provide capacitive coupling between the field-shaping conductors. In one embodiment all of the field-shaping conductors can be floating (i.e., isolated from any external electrical contact). In another embodiment, one of the field-shaping conductors is connected to gate 110 via a connection and the other field-shaping conductors are floating. In another embodiment one of the field-shaping conductors in each of the inactive FCC regions 125A-125E is connected to the gate 110 while the other field-shaping conductors are floating. Field-shaping regions according to embodiments can include two or more field-shaping conductors capacitively coupled to each other within an insulating matrix. At least one of these field-shaping conductors can be floating. The floating field-shaping conductor has substantially no net charge. In some embodiments, gate 110 is connected to the nearest field-shaping conductor in each of the inactive FCC regions 125A-125E. The combination of the conductive materials and insulators forms the floating coupled capacitors, which are coupled to various other conductive portions of the device, as explained below with reference to FIG. 1C.

Stacking active drift regions on top of each other separated by layers of inactive FCC regions, as shown in FIG. 1A, reduces the total resistance between source 105 and drain 115 and increases the total current between source 105 and drain 115. If each active drift region has a resistance of $R_{di}$, where i is the active drift region number, and carries a current of $I_{di}$, where i is the active drift region number, then the total resistance (R) and total current (I) between the source and the drain when there are five layers present is:

$$1/R = 1/R_{d1} + 1/R_{d2} + 1/R_{d3} + 1/R_{d4} + 1/R_{d5}$$

$$I = I_{d1} + I_{d2} + I_{d3} + I_{d4} + I_{d5}$$

In one embodiment, where all of the active drift regions and all of the inactive floating coupled capacitor regions are substantially the same so that the resistances of all of the drift layers are substantially the same (i.e. $R_{d1} = R_{d2} = R_{d3} = R_{d4} = R_{d5}$), the total resistance $R = (1/5) \times R_{d1}$ and $I = 5 \times I_{d1}$.

Figure 1B:
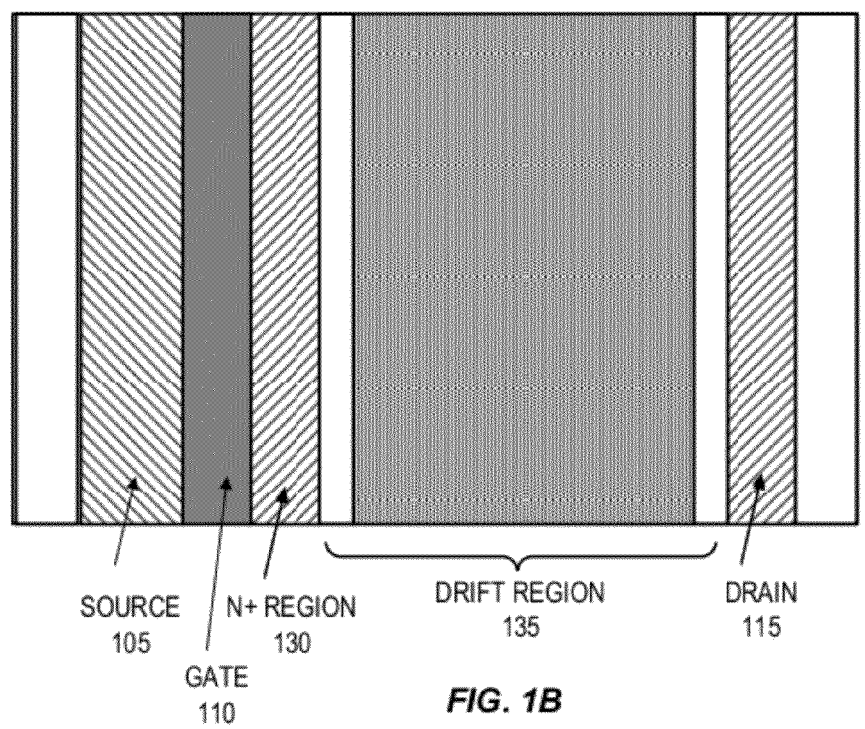
FIG. 1B is a top view of the semiconductor device of FIG. 1A that can incorporate an embodiment of the invention.

FIG. 1B is a top view of the FET device illustrated in FIG. 1A.

Figure 1C:
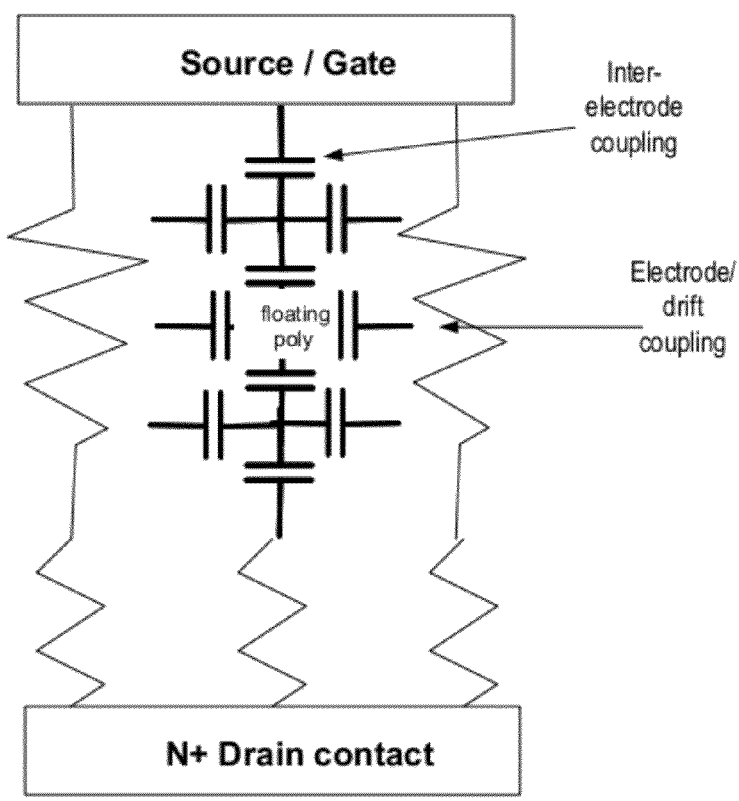
FIG. 1C is an illustration showing the capacitive coupling between different components of the semiconductor device illustrated in FIG. 1A.

FIG. 1C is an illustration showing schematic circuit diagram between the different components of the semiconductor device illustrated in FIG. 1A. The circuit diagram schematic illustrates inter-electrode coupling, electrode/drift region coupling and the resistance between the source and the drain. The coupling is a capacitive coupling. The inter-electrode coupling is the capacitive coupling between the field-shaping conductors located within a single inactive FCC regions 125A-125E. In addition to being capacitively coupled to each other, as represented by the inter-electrode coupling, the field-shaping conductors can also be capacitively coupled to the active drift regions 120A-120D, as represented by the electrode/drift region coupling. The electrode/drift region coupling effects the electric fields within the active drift regions 120A-120D. As indicated above, the capacitive coupling of the field-shaping conductors to each other and the capacitive coupling of the field-shaping conductors to the drift region, allow electric field non-uniformity to be reduced in the drift region, thereby increasing breakdown voltage. Parameters of the inactive FCC regions 125A-125E can be predetermined to provide such increased field uniformity. Examples of parameters include spacings between the field-shaping conductors, composition of the active drift regions 120A-120D, doping of the active drift regions 120A-120D, compositions of the field-shaping conductors, dopings of the field-shaping conductors, spacings between the field-shaping conductors and the active drift regions 120A-120D, compositions of the electrically insulating regions of the field-shaping regions, and dielectric constants of the electrically insulating regions of the inactive FCC regions 125A-125E.

Embedding the field-shaping conductors in the drift region allows improved inter-electrode coupling (i.e. field-shaping conductor to field-shaping conductor capacitive coupling) and electrode/drift region coupling (i.e. field-shaping conductor to drift region capacitive coupling) compared to other arrangements. The capacitive inter-electrode coupling and electrode/drift region coupling are varied to provide high breakdown voltage and low on-resistance simultaneously. According to an embodiment of the invention, the capacitive inter-electrode coupling and electrode/drift region coupling are set to be substantially the same. According to another embodiment of the invention, the capacitive inter-electrode coupling is set to be higher than the capacitive electrode/drift region coupling. The inter-electrode coupling is adjusted by adjusting the oxide thickness. For example, increasing the oxide thickness reduces the inter-electrode coupling. Also, electrode/drift coupling is adjusted by changing the dopant concentration (N, N+ or P+).

Figure 2A:
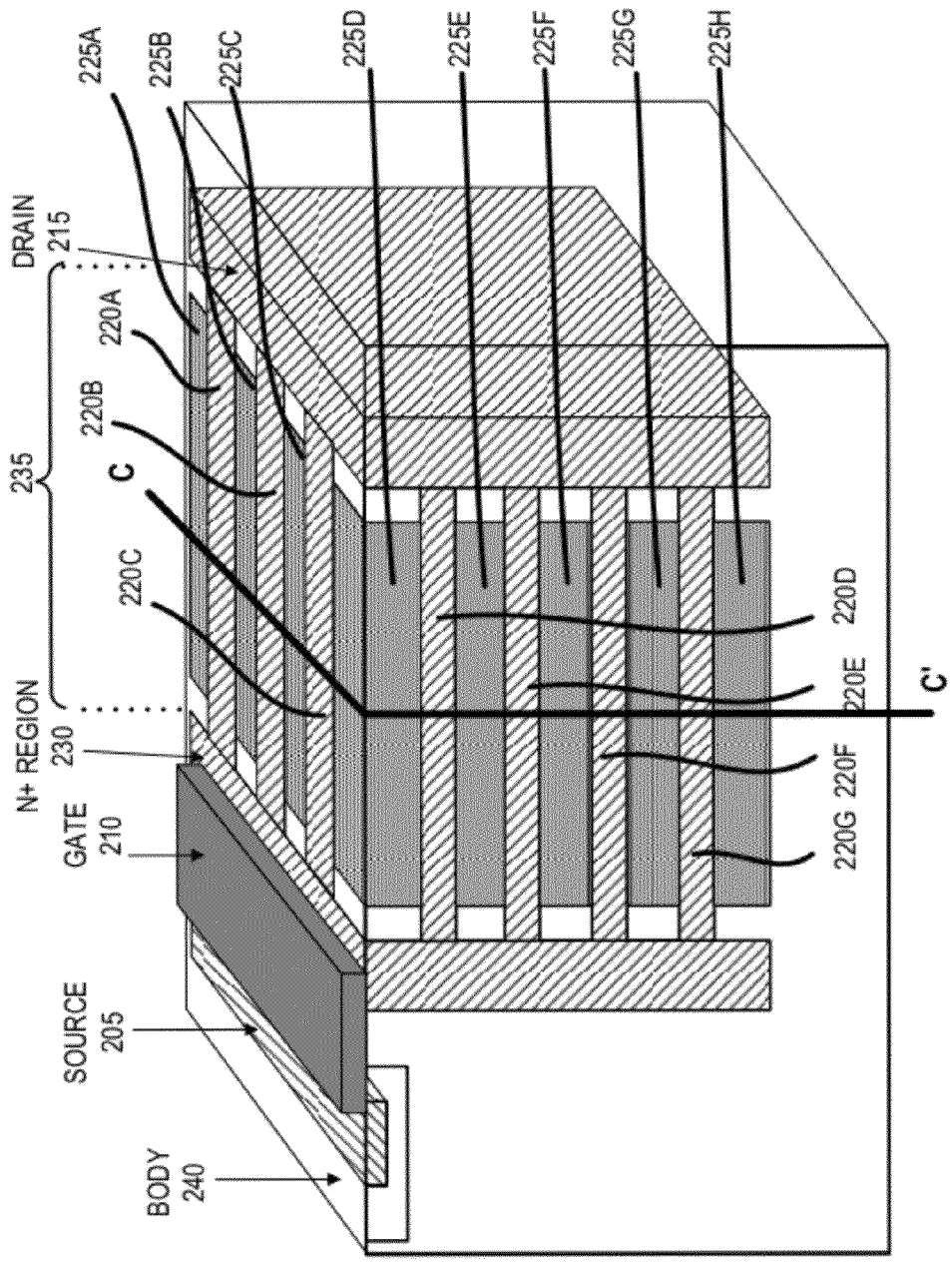
FIG. 2A is an illustration of a semiconductor device that can incorporate an embodiment of the invention.
Figure 2B:
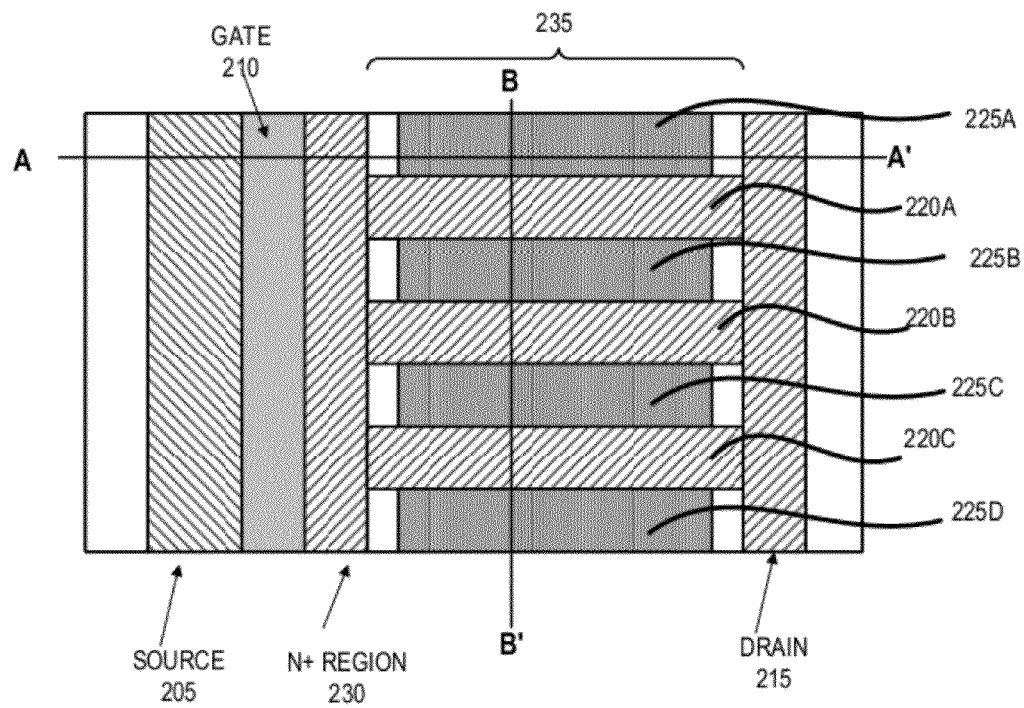
FIG. 2B is the top view of the semiconductor device of FIG. 2A.
Figure 2C:
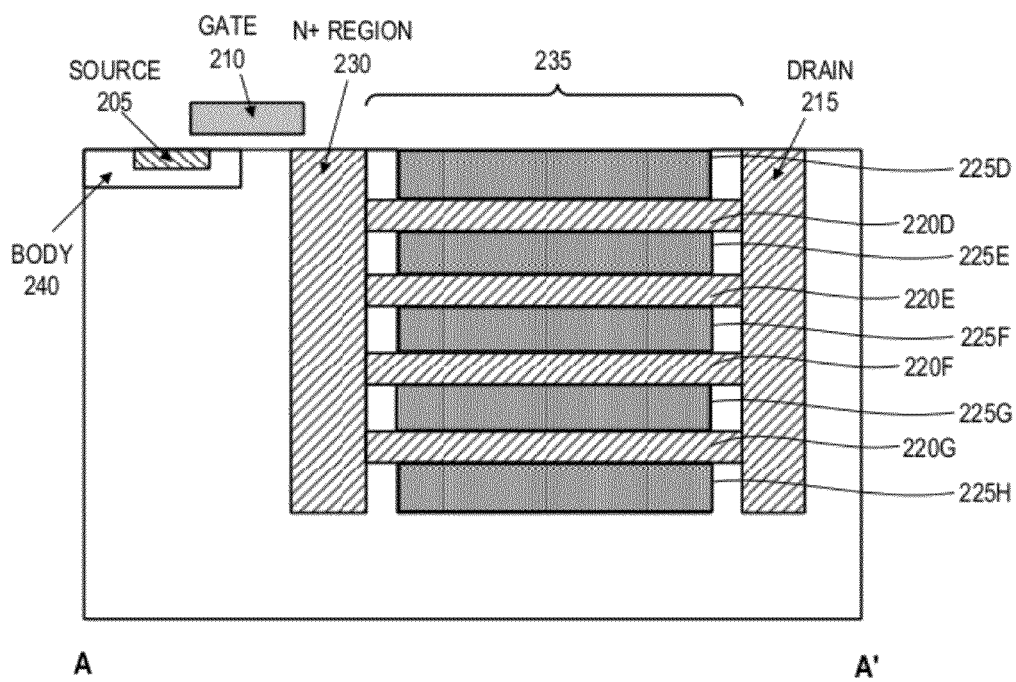
FIG. 2C is a cross sectional view of the semiconductor device of FIG. 2A along the cutline A-A' illustrated in FIG. 2B.
Figure 2D:
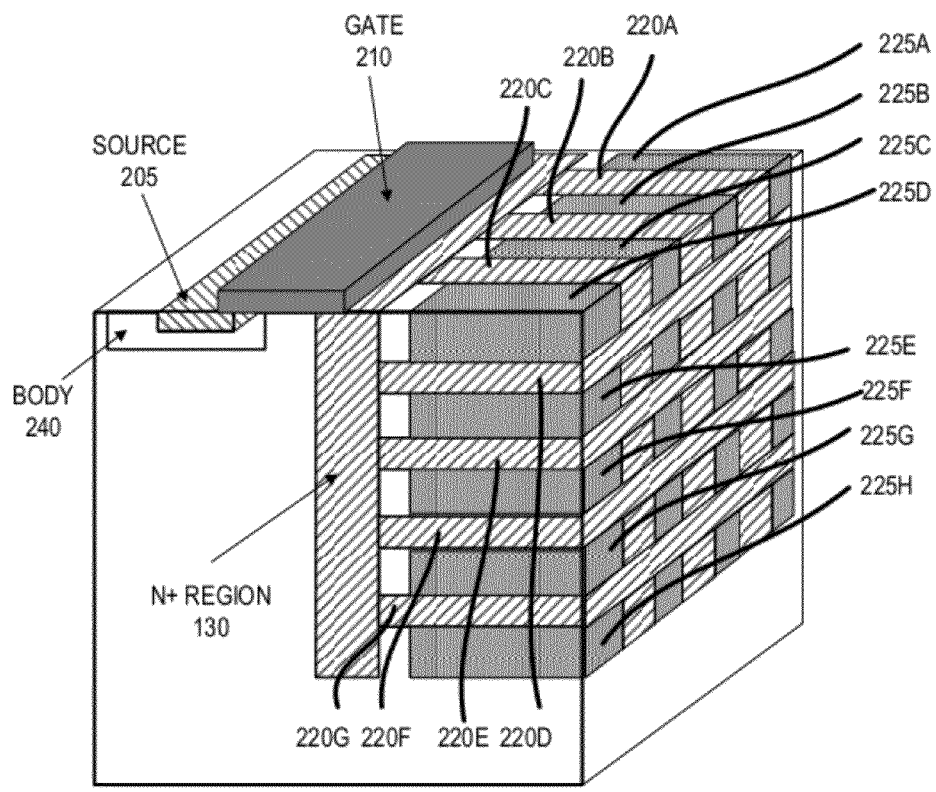
FIG. 2D is a cross sectional view of the semiconductor device similar to FIG. 2A along the plane C-C' illustrated in FIG. 2A.
Figure 2E:
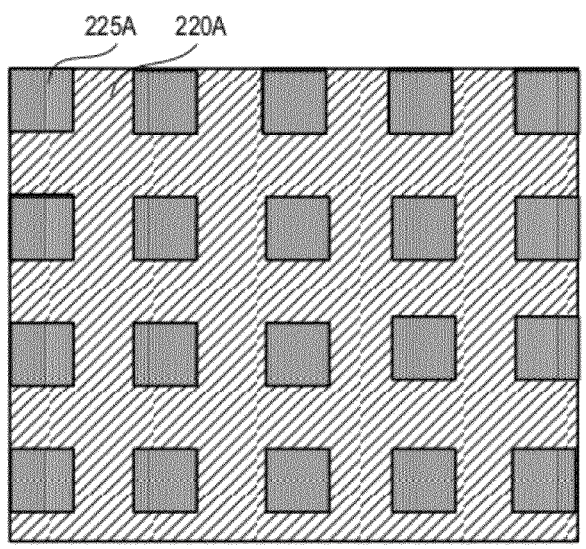
FIG. 2E is a cross sectional view of the semiconductor device of FIG. 2A along the cutline B-B' illustrated in FIG. 2B.

FIG. 2A is an illustration of another embodiment of a semiconductor device having a mesh structure formed from active drift regions and inactive FCC regions. In this embodiment, inactive FCC regions can be both laterally trenched and vertically stacked, to provide an FCC mesh structure separating an array of active drift regions that are used as current conduction paths. FIG. 2A includes a source 205, a gate 210, a drain 215, active drift regions 220A-220G, inactive FCC regions 225A-225H, an N+ buffer region 230 and a body 240. The drift region includes multiple active drift regions 220A-220G which are formed throughout the drift area including the top of the drift area where the active drift regions are identified as 220A-220C and within the drift region where the active drift regions are identified as 220D-220G. Similarly, the drift region includes multiple inactive FCC regions 225A-225H which are formed throughout the drift region including the top of the drift region where the inactive FCC regions are identified as 225A-225D and within the drift region where the inactive FCC regions are identified as 225D-225H. The N+ buffer region 230 is made of conductive material that makes electrical contact between the active drift regions 220A-220G and a channel formed under the gate 210. The source 205 is disposed in the body 240, which is a conductor. When sufficient voltage is applied to the gate 210 a channel forms under the gate 210 and current flows from the source 205 through the channel to the N+ buffer region 230 to the active drift regions 220A-220G and to the drain 215. FIG. 2B is a top view of the embodiment illustrated in FIG. 2A. FIG. 2C is a cross sectional view of FIG. 2B through cut line A-A' showing the vertical stacking of active drift regions 220A-220G and inactive FCC regions 225A-225H. FIG. 2D illustrates a cross sectional view of FIG. 2A through the plane C-C'. FIG. 2D illustrates the mesh structure formed by active drift regions 220A-220G and inactive FCC regions 225A-225H. FIG. 2E is a cross sectional view of FIG. 2B, through cut line B-B', showing the mesh structure formed by active drift regions 220A-220G and inactive FCC regions 225A-225H.

The inactive FCC regions shown in both FIGS. 1A and 2A, can have many floating field-shaping conductors or floating electrodes spreading the applied voltage evenly across the length of the active drift regions and can thus minimize the on-resistance keeping the breakdown voltage high. In one embodiment, the inactive FCC regions can include a single field-shaping conductor or electrode per trench made with polysilicon surrounded by an oxide layer. The field-shaping conductor or electrode can form an equipotential around the width of the active drift region from source to drain at each of the inactive FCC regions, which spreads the voltage uniformly and shapes the electric field to increase the breakdown voltage. In another embodiment the breakdown voltage is affected by the number of field-shaping conductors or electrodes in one trench. In one embodiment having a 50 μm trench, the maximum breakdown voltage is achieved using 40 field-shaping conductors or electrodes in the trench. The breakdown voltage varies linearly as a function of number of field-shaping conductors or electrodes up to approximately 40. If more than 40 field-shaping conductors or electrodes are used the breakdown voltage is not affected.

Figure 3A:
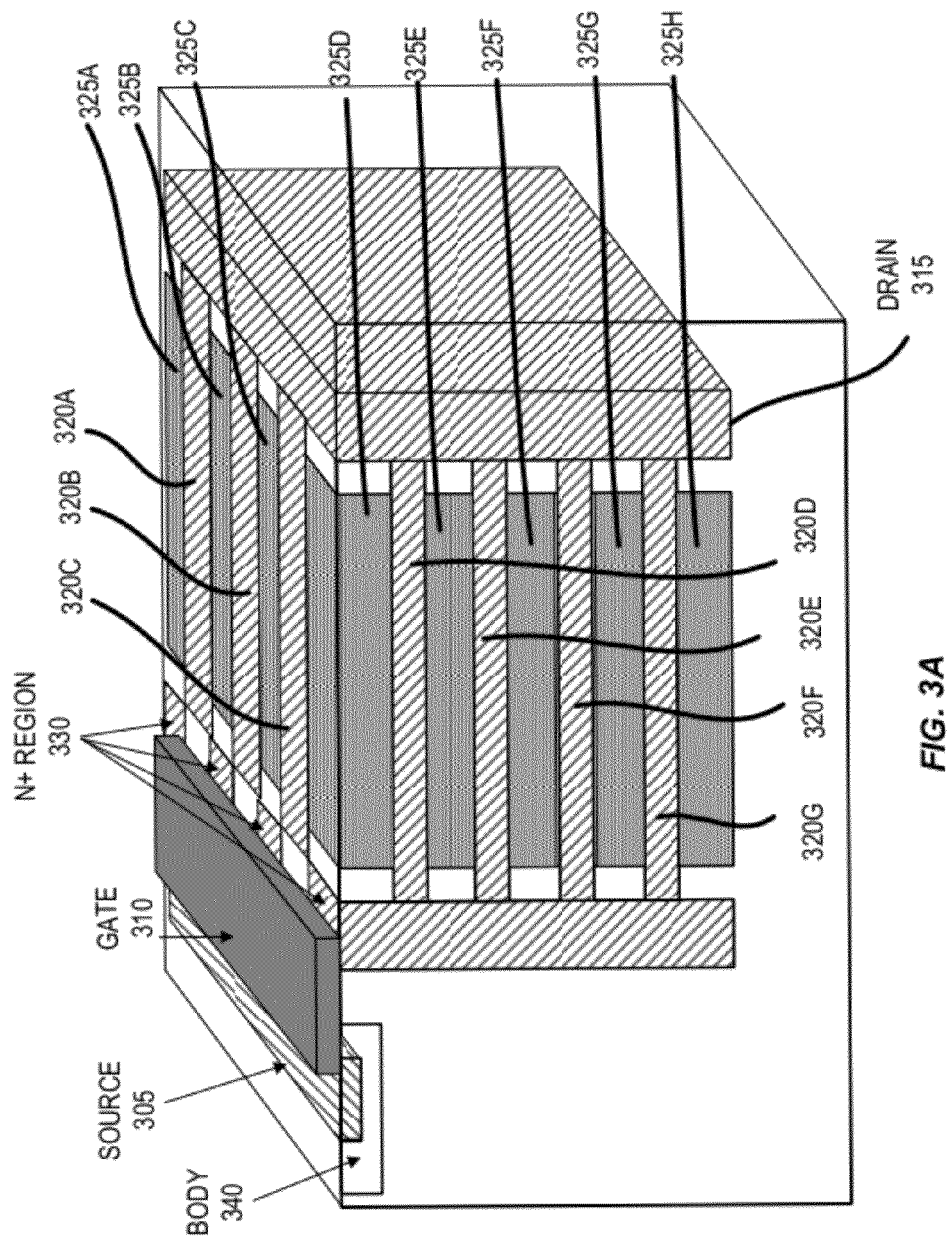
FIG. 3A is an illustration of a semiconductor device with interrupted N+ regions that can incorporate an embodiment of the invention.

FIG. 3A illustrates an embodiment similar to the embodiment shown in FIG. 2A but with interrupted N+ buffer region 330. FIG. 3A includes a source 305, a gate 310, a drain 315, active drift regions 320A-320G, inactive FCC regions 325A-325H, an interrupted N+ buffer region 330 and a body 340. The source 305, gate 310, drain 315, active drift regions 320A-320G and inactive FCC regions 325A-325H are similar to the corresponding regions described above with reference to FIG. 2A. The interrupted N+ buffer region 330 is similar to the N+ buffer region shown in FIGS. 1A and 2A except that it is not a contiguous region when view along a plane. Although the N+ buffer regions are not contiguous when viewed along a plane such as the surface; the N+ buffer regions are all interconnected via drift layers on the surface overlap area and underneath the surface. In one embodiment, the interrupted N+ buffer region 330 contacts all of the active drift regions 320A-320G that are both on top of the device as well as vertically stacked in the drift regions, as explained above with reference to FIG. 2A. The heavily doped part (N+) of the drift region closest to the gate 310 is divided into segments roughly aligned with the inactive FCC regions 325A-325H, but also overlapping with the active drift regions 320A-320G. The N+ buffer region 330 is made of conductive material that makes electrical contact between the active drift regions 320A-320G and a channel formed under the gate 310. The source 305 is disposed in the body 340, which is a conductor. When sufficient voltage is applied to the gate 310 a channel forms under the gate 310 and current flows from the source 305 through the channel to the N+ buffer region 330 to the active drift regions 320A-320G and to the drain 315. This configuration spreads the current deeper inside the active drift region by making electrical contacts to additional active drift regions that are buried below the surface, which reduces the on-resistance. The total on-resistance is reduced according to the relationship $1/R=\Sigma(1/R_{di})$, as described above with reference to FIG. 1A.

Figure 3B:
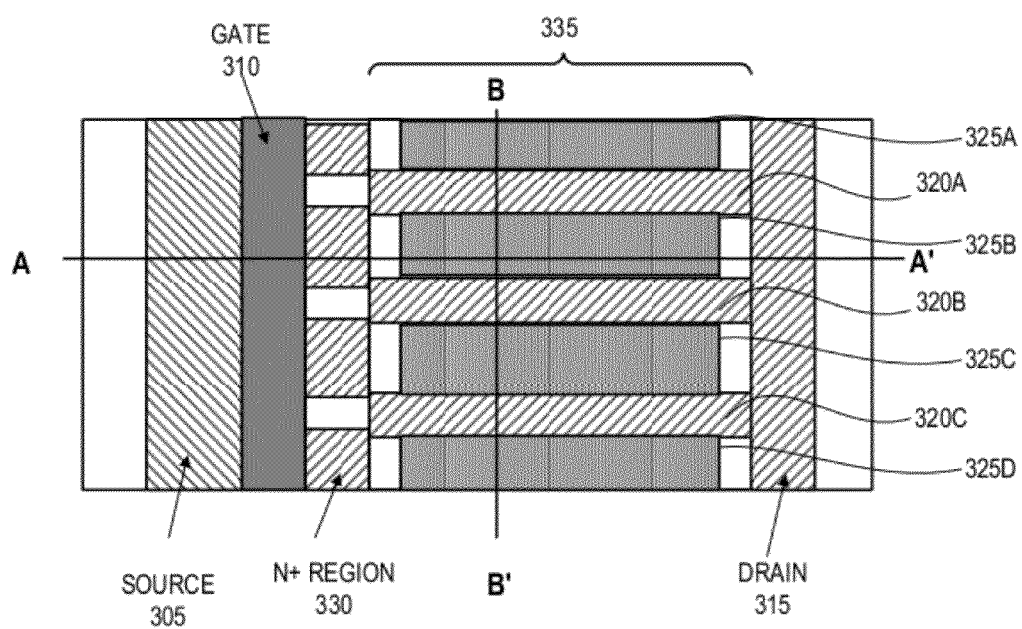
FIG. 3B is the top view of the semiconductor device of FIG. 3A.

FIG. 3B is a top view of the FET device illustrated in FIG. 3A.

Figure 4A:
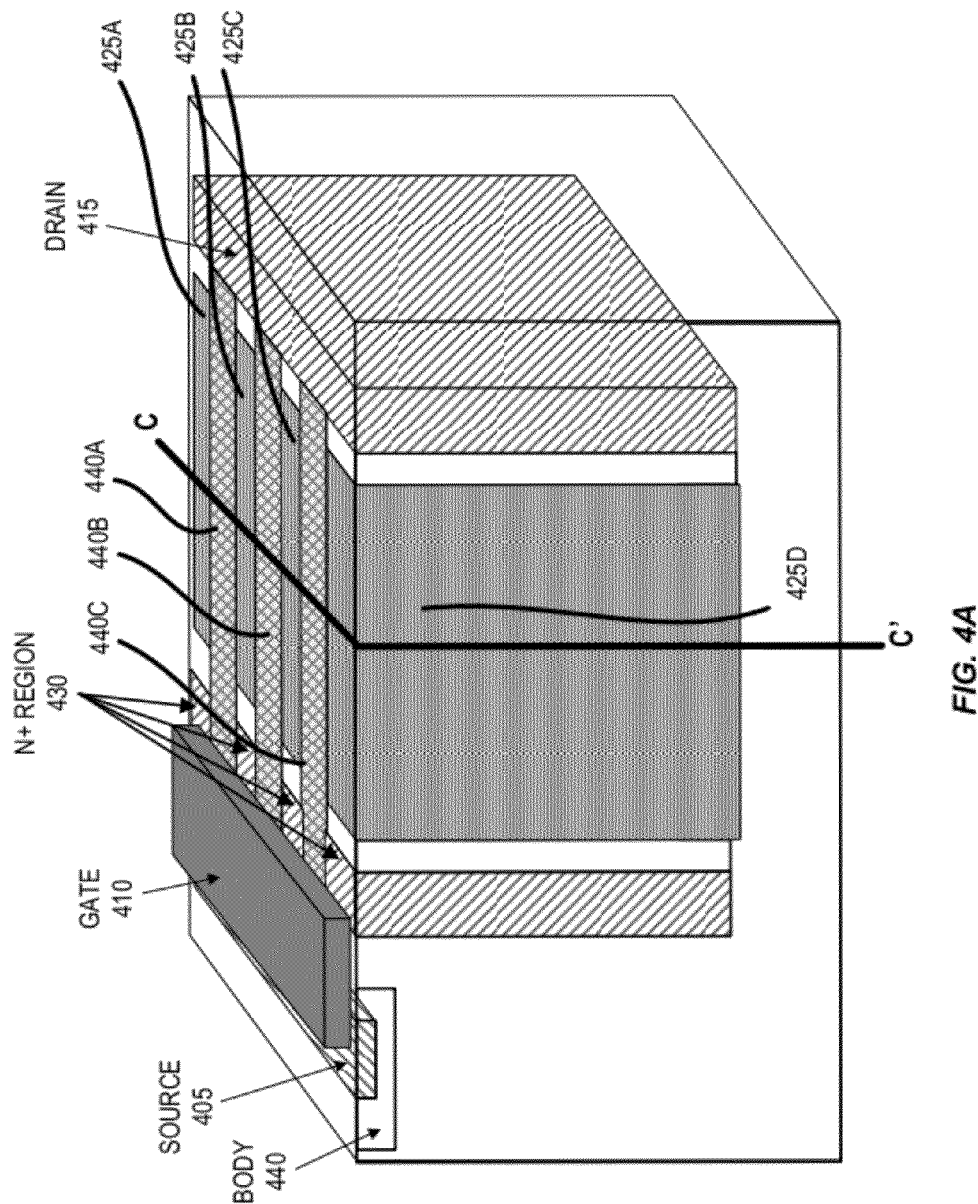
FIG. 4A is an illustration of a semiconductor device with pn junctions in the drift layers that can incorporate an embodiment of the invention.
Figure 4B:
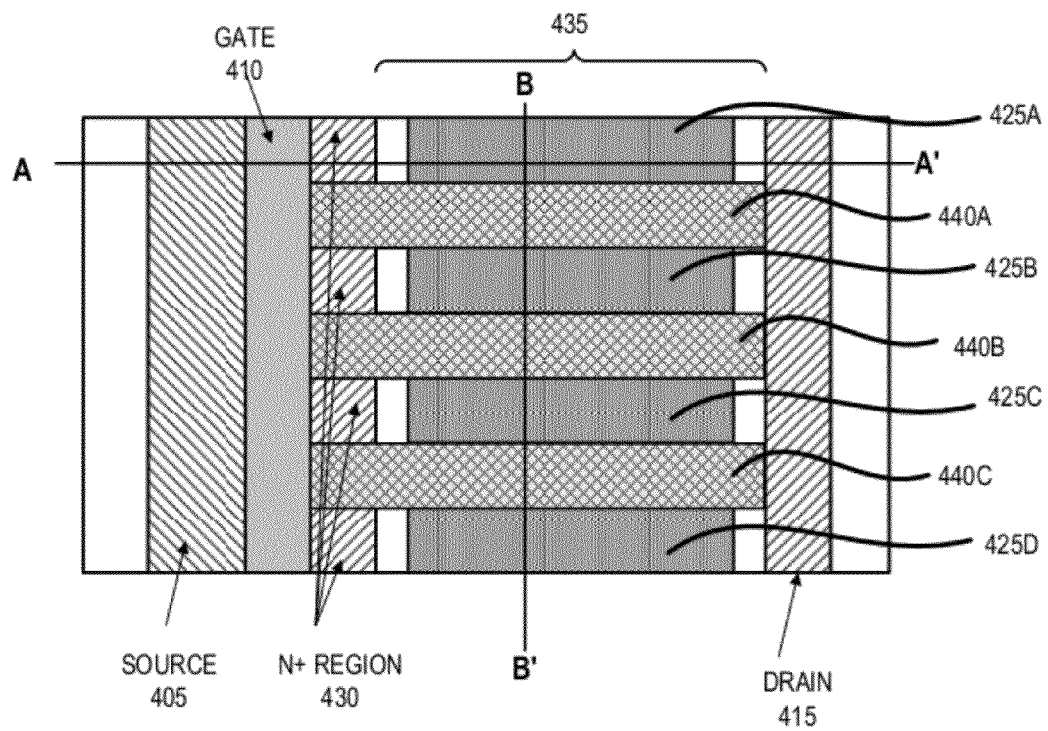
FIG. 4B is the top view of the semiconductor device of FIG. 4A.
Figure 4C:
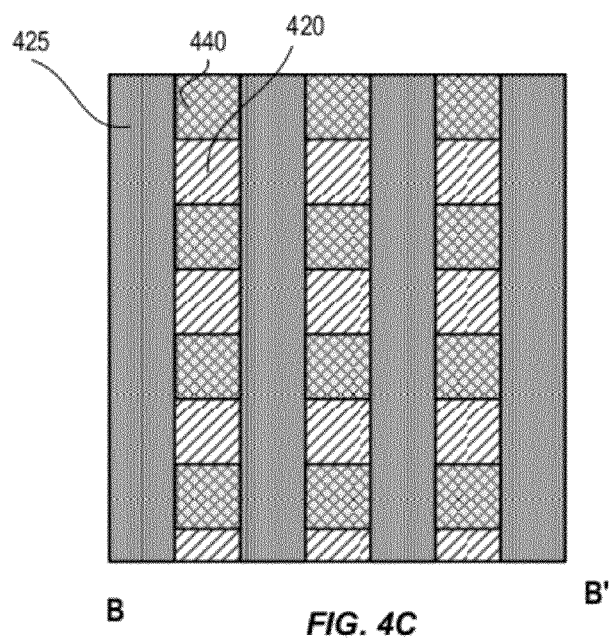
FIG. 4C is a cross sectional view of the semiconductor device of FIG. 4A along the cutline B-B' illustrated in FIG. 4B.

FIG. 4A is an illustration of a field effect transistor (FET) having floating coupled capacitor (FCC) regions and pn junctions in the active drift region including a source 405, a gate 410, a drain 415, active drift regions (not shown), inactive vertical FCC regions (four shown) 425A-425D, P-resurf regions (three shown) 440A-440C, an interrupted N+ buffer region 430 and a body 440. FIG. 4B is a top view of FIG. 4A. FIG. 4C is a cross sectional view of FIGS. 4A and 4B along the cut line B-B' shown in FIG. 4B. FIG. 4C includes active drift regions 420, inactive vertical FCC regions 425, and P-resurf layers 440. The active drift regions 420 and the P-resurf layers 440 create a pn junction. The active drift regions 420 have a structure that include alternating pn junctions which are in vertically stacked as explained with reference to FIGS. 4D and 4E. The interrupted N+ buffer region 430 has segments aligning with the inactive vertical FCC regions 425A-425D. The P-resurf regions 440A-440C extend to the gate 410. In one embodiment, the P-resurf regions 440A-440C can be electrically connected to a ground through a connection to a P-body 440, and then to the substrate in a low-side LDMOS. This connection establishes an electrode-substrate coupling in an FCC trench. The N+ buffer region 430 is made of conductive material that makes electrical contact between the active drift regions and a channel formed under the gate 410. The source 405 is disposed in the body 440, which is a conductor. When sufficient voltage is applied to the gate 410 a channel forms under the gate 410 and current flows from the source 405 through the channel to the N+ buffer region 430 to the active drift regions and to the drain 415.

The FET illustrated in FIG. 4A can be formed by disposing one or more vertical pn junctions on portions of the drift regions that are between the inactive vertical FCC regions 425A-425D. This vertically stacked alternating P-N layer structure can be epitaxially grown before the FCC trench is etched. The same procedure can be used to form a number of isolated floating electrodes in the FCC trench after multi p-n epitaxy layers are deposited. The addition of pn junctions to the active drift region can increase the carrier concentration in the active drift region by about a factor of two, thereby substantially reducing the on-resistance of the device. In one example, if a box-like doping profile is used, then incorporation of P-resurf layers can increase n-drift concentration from $1 \times 10^{16}/cm^3$ to $2 \times 10^{16}/cm^3$ while maintaining breakdown voltage.

Figure 4D:
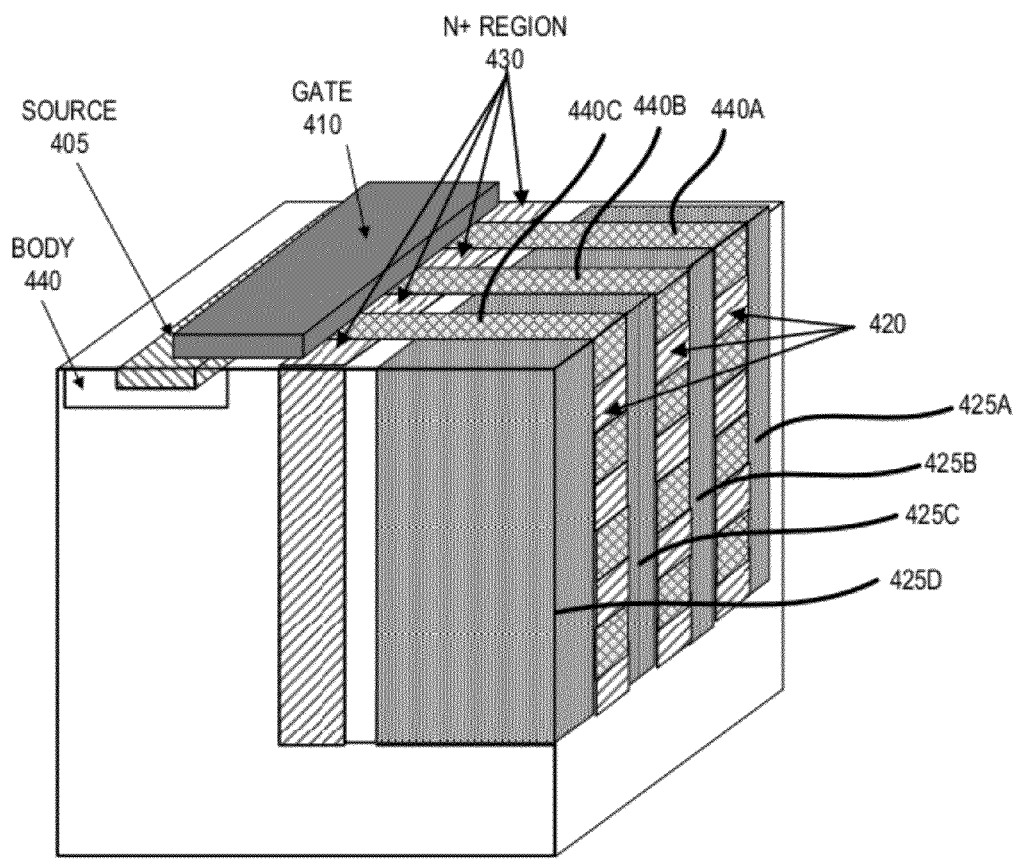
FIG. 4D is an illustration of a semiconductor device similar to FIG. 4A along the plane C-C' illustrated in FIG. 4A

FIG. 4D is a cross sectional illustration of the semiconductor device shown in FIG. 4A along the plane C-C'. The semiconductor device of FIG. 4A includes pn junctions in the active drift regions, vertical inactive FCC regions 425A-425D located on each side of an active drift regions 445. The active drift regions 445 includes a stack of pn junctions which can increase the carrier concentration in the active drift region by about a factor of two, thereby substantially reducing the on-resistance of the device. The thickness of the individual p and individual n layers can vary depending on the dosage.

Figure 4E:
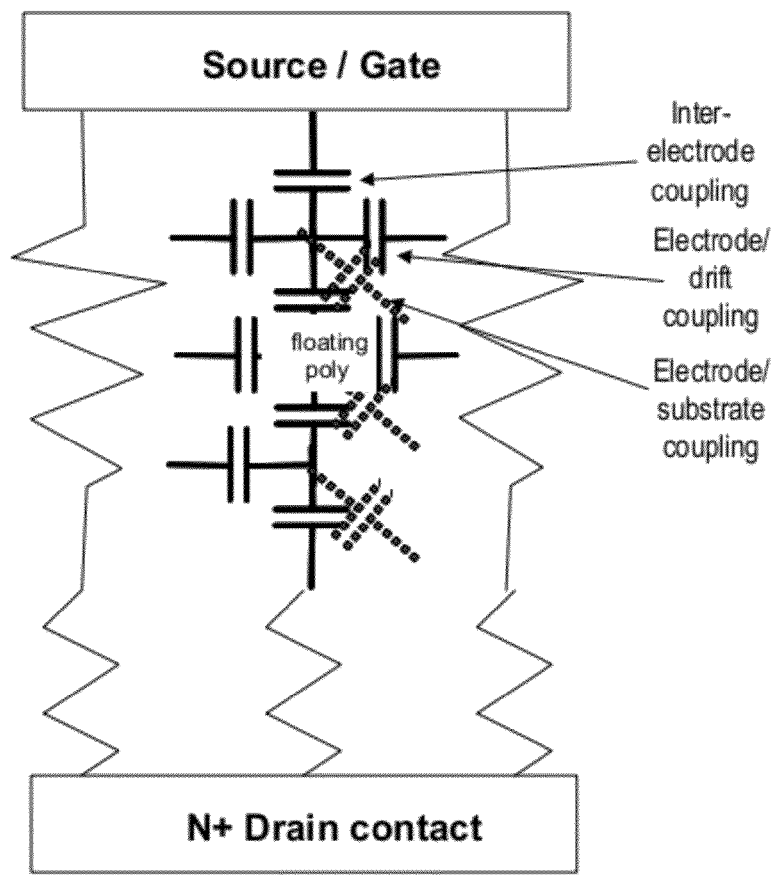
FIG. 4E is an illustration showing the capacitive coupling between different components of the semiconductor device illustrated in FIG. 4A.

FIG. 4E is a schematic circuit diagram including various different components of the semiconductor device illustrated in FIG. 4A, which is similar to the schematic circuit diagram illustrated in FIG. 1C except that FIG. 4E includes an additional field-shaping conductor or electrode to substrate coupling. The embodiment illustrated in FIG. 4A has a field-shaping conductor or electrode to substrate coupling because the FCC trenches extend through p-n junctions where P-resurf layers have connection to substrate through transistor body regions. The schematic circuit diagram illustrates inter-electrode coupling, electrode/drift region coupling, electrode/substrate coupling, and drain resistance along the active drift regions. The coupling is a capacitive coupling. The inter-electrode coupling is the capacitive coupling between the field-shaping conductors located within a single inactive FCC region 425A-425D. In addition to being capacitively coupled to each other as represented by the inter-electrode coupling, the field-shaping conductors can also be capacitively coupled to the active drift regions 445, as represented by the electrode/drift region coupling. Further, the field-shaping conductors or electrodes are coupled to the substrate. According to an embodiment, the capacitive inter-electrode coupling, electrode/drift region coupling and electrode to substrate coupling are set to be substantially the same. According to another embodiment, the capacitive inter-electrode coupling is set to be higher than the capacitive electrode/drift region coupling and the capacitive electrode to substrate coupling. The inter-electrode coupling can be adjusted by adjusting the oxide thickness. For example, increasing the oxide thickness reduces the inter-electrode coupling. Also, electrode/drift coupling is adjusted by changing the dopant concentration (N, N+ or P+). The electrode substrate coupling is adjusted by adjusting the depth of the inactive FCC region and therefore the distance between the inactive FCC region and the substrate. The electrode/drift region coupling effects the electric fields within the active drift regions 120A-120D. As indicated above, the capacitive coupling of the field-shaping conductors to each other and the capacitive coupling of the field-shaping conductors to the drift region, allow electric field non-uniformity to be reduced in the drift region, thereby increasing breakdown voltage.

Figure 5:
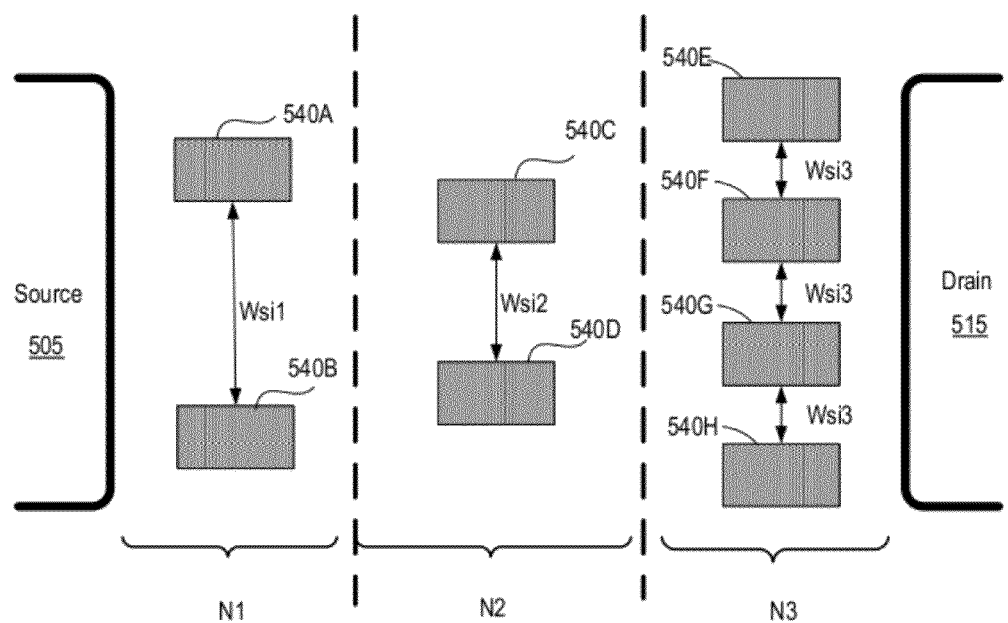
FIG. 5 is a top view of a semiconductor device with lateral floating charge control (FCC) devices that uses field-shaping regions to improve the breakdown voltage to on-resistance tradeoff, according to an embodiment.

FIG. 5 is a top view of a semiconductor device including a source 505, a drain 515, and field-shaping conductors (eight shown) 540A-540H that are used to reduce on-resistance and increase breakdown voltage. The field-shaping conductors 540A-540H, which are located within the active drift region, are separated by distances labeled as $W_i$. In one embodiment, the separation distances $W_i$ of the field-shaping conductors 540A-540 are selected so that the carrier concentration of the active drift regions and the separation distances $W_i$ have an inverse relation. In another embodiment, multi-tier active drift regions are added to reduce on-resistance and increase breakdown voltage. The added active drift regions have higher doping concentrations compared to the first active drift region, and narrower field-shaping conductor separation (i.e. electrode-separation) $W_i$. In one embodiment, the lightest doped drift region is closest to the source region, and the highest doped drift region is closest to the drain. The use of lighter doped regions near the source and heavier doped regions near the drain increases breakdown voltage. For example, as shown in FIG. 5, if $N_1$ is the concentration of the first active drift region closest to the source with $W_{si1}$ field-shaping conductor separation distance, then the relations follow:

$$N_1 < N_2 < N_3 \text{ and } W_{si1} > W_{si2} > W_{si3}$$

These different dopant concentrations allow the fabrication of semiconductor device having field-shaping electrodes with a lower on-resistance per unit area, since a portion of the drift region has a lower dopant concentration. One embodiment provides for the regions having different doping concentrations to also be present in the termination regions, to prevent the device from breaking down first in this region. By having the concentration in the termination region always be lower than in the drift region, in this embodiment, this feature is met.

Figure 6:
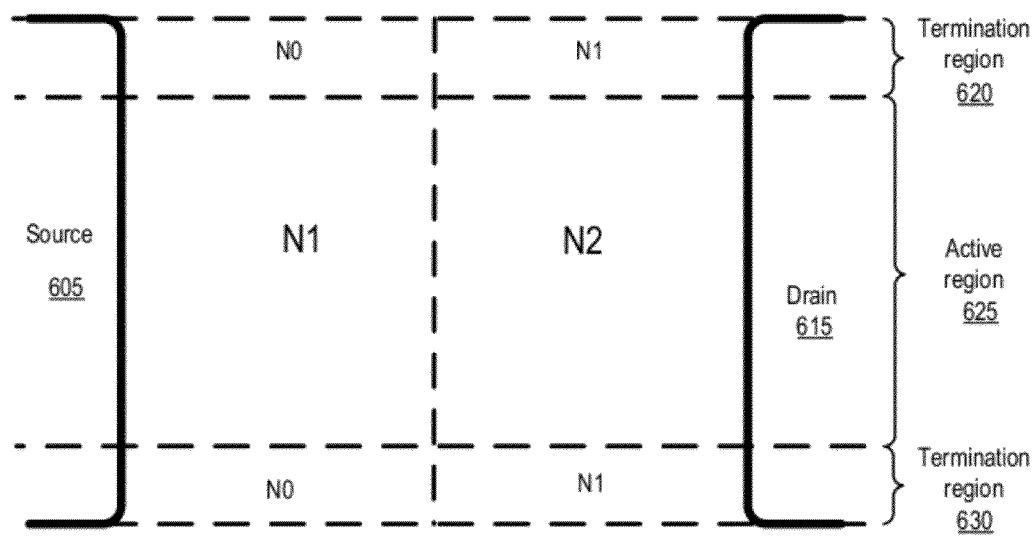
FIG. 6 illustrates a semiconductor device with an adaptive FCC structure having regions that have three different doping concentrations, according to an embodiment.

FIG. 6 illustrates a semiconductor device with an adaptive FCC structure having regions that have three different doping concentrations ($N_0$, $N_1$, $N_2$) including a source 605, a drain 615, a first termination region 620, an active region 625, and a second termination region 630. The source 605 and drain 615 extends across the first termination region 620, the active region 625 and the second termination region 630. In one embodiment, the doping concentrations of the adaptive FCC structure have the following relationship $N_2 > N_1 > N_0$. The embodiment illustrated in FIG. 6 has a concentration in the termination region that is always lower than in the drift region, which prevents the device from breaking down first in the termination region. In this embodiment the first termination region 620 and the second termination region 630 each have doping concentrations of $N_0$ and $N_1$, where $N_0$ is closer to the source and $N_1$ is closer to the drain. The active region 625 has doping concentrations of $N_1$ and $N_2$, where $N_1$ is closer to the source and $N_2$ is closer to the drain. The portion of the active region 625 having $N_1$ is near the portions of the first termination region 620 and second termination region 630 having concentration $N_0$. The portion of the active region 625 having $N_2$ is near the portions of the first termination region 620 and second termination region 630 having concentration $N_1$. With this configuration the condition $N_2 > N_1 > N_0$ is satisfied preventing the device from breaking down first in the termination region. The transition between $N_0$ and $N_1$ in the termination regions can be abrupt or smooth. Similarly, the transition between $N_1$ and $N_2$ in the active region can be abrupt or smooth. However, the concentration transitions in active region and the termination regions track each other so that the condition $N_2 > N_1 > N_0$ is satisfied.

Figure 7A:
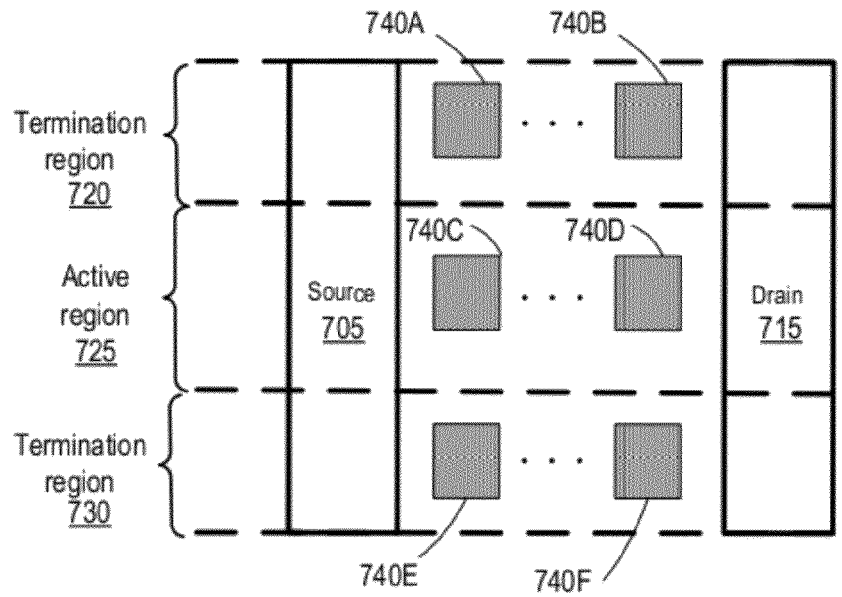
FIGS. 7A and 7B illustrate two semiconductor devices with two different trench dimensions that allow breakdown to occur in a location that does not result in catastrophic failure.
Figure 7B:
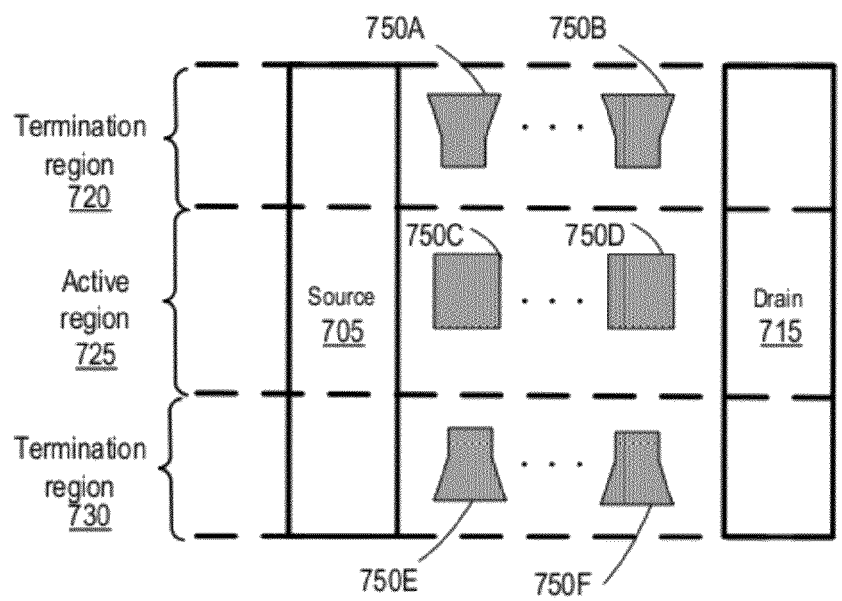

FIGS. 7A and 7B illustrate two semiconductor devices with two different trench dimensions 740A-740H and 750A-750H, respectively, including a source 705, a drain 715, a first termination region 720, an active region 725, and a second termination region 730 that allow breakdown to occur in a location that does not result in catastrophic failure. In one embodiment, the trenches 740A-740H are generally the same shape and size. In this embodiment, the breakdown is maximized by optimizing the trench 740A-740H size and by optimizing the trench spacing in both the x-direction and the y-direction. Further, the number of trenches formed between the source and the drain are optimized. Increasing the number of trenches in the x-direction between the source 705 and the drain 715 increases the breakdown voltage in the active region 725. Increasing the number of trenches in the y-direction towards the edge of the termination regions 720 and 730 increases the breakdown voltage in the termination regions 720 and 730. In both cases, the trench spacing can be optimized to minimize the chances of premature breakdown occurring before full depletion of charges in silicon mesa located between trenches.

The trench dimension in the direction of the line between the source 705 and the drain 715 can be changed in the termination region. FIG. 7B illustrates an embodiment where the trench 750A-750B and 750E-750F dimensions in the termination area are different than the trench 750C-750D in the active area. For example, by widening the trenches or a portion of the trenches in the termination region only as illustrated in trenches 750A-750B and 750E-750F, the breakdown voltage in the termination is increased above the breakdown voltage in the interior of the device. The device can be further altered to allow the breakdown to occur in a location that does not result in catastrophic failure, as illustrated in FIGS. 7A and 7B.

Figure 8A:
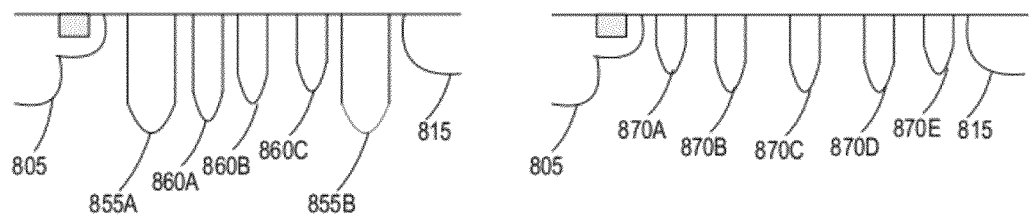
FIG. 8A illustrates two relative trench widths that may be used, according to embodiments.

FIG. 8A illustrates two relative trench widths that may be used to effect the shape of the electric field in the z-direction of the device which can result in decreasing on-resistance and increasing breakdown voltage. The illustration on the left of FIG. 8A shows a source 805, a drain 815, two deep and wide trenches 855A-855B, and three shallower and narrower trenches 860A-860C. The illustration on the right of FIG. 8A shows the source 805, the drain 815, and five trenches 870A-870E that are substantially the same width but vary in depth with the shallowest being near the source 805 and drain 815 and the deepest in the center. The trench size in the direction of a line between the source 805 and the drain 815 can be varied as shown in these two illustrations. Changing the depth or width of the trenches can change the affect that the floating coupled capacitors FCC in the trench have on the shape of the electric field in the z-direction in the device. Increasing the depth of the trench can also increase the capacitive coupling between field-shaping conductors located in the trench with the substrate.

Figure 8B:
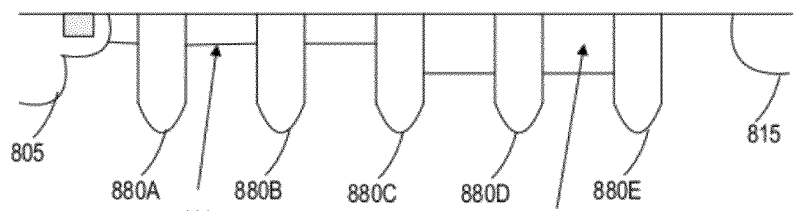
FIG. 8B illustrates how more than two trench widths can be used in the transition region between two areas having different doping concentrations in an adaptive FCC structure to prevent a high electric field, according to embodiments.

FIG. 8B illustrates how more than two trench widths can be used in the transition region between two areas having different doping concentrations in an adaptive lateral FCC structure to prevent a high electric field. The illustration of FIG. 8B shows the source 805, the drain 815, and five trenches 880A-880E that are substantially the same width and depth but have different doping concentration $N_2$ and $N_1$ between the trenches 880A-880E. In one embodiment $N_2 > N_1$. This aspect may also be used in the transition region between two areas having different doping concentrations in an adaptive lateral FCC structure to prevent a high electric field.

Figure 9:
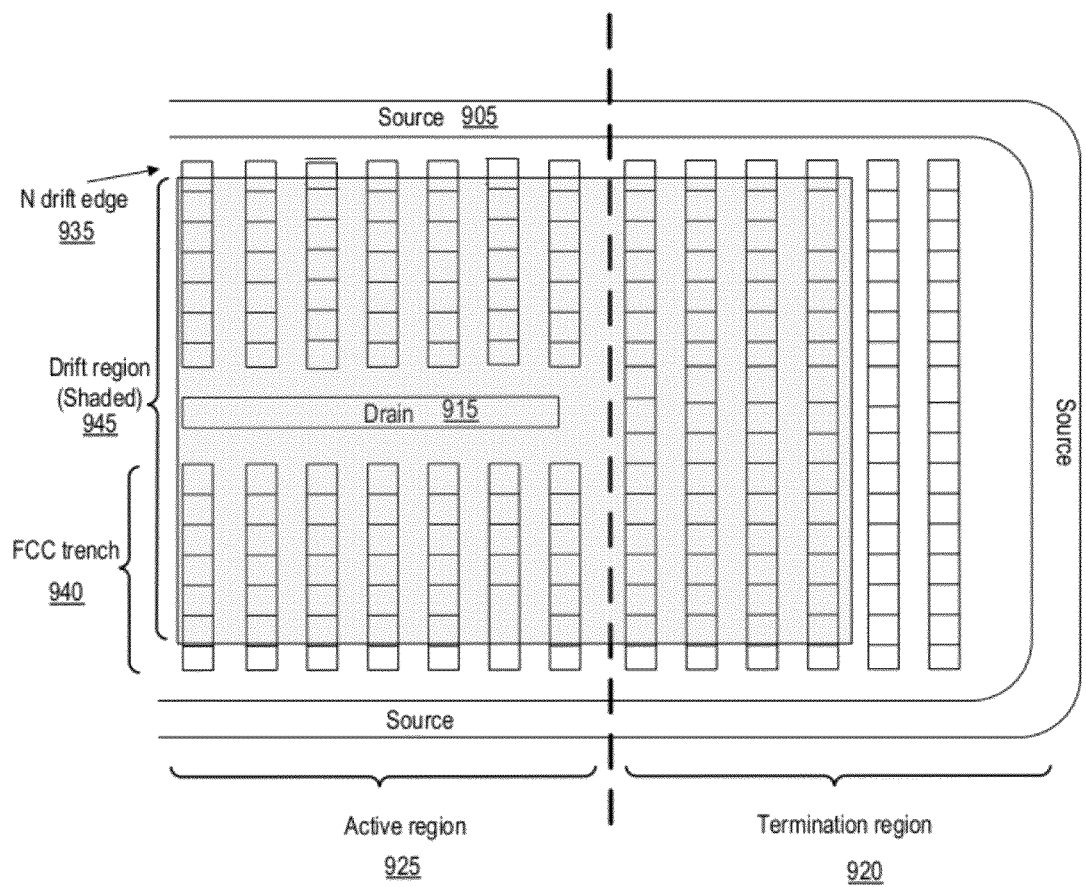
FIG. 9 is a top view of a semiconductor device having lateral floating charge control (FCC) structure with the FCC structures in the termination region parallel to the FCC structures in the active region, according to embodiments.

In another embodiment, the drift region doping structure is optimized such that the drift region doping can be increased significantly without degradation of the breakdown voltage. In the embodiment illustrated in FIG. 9, an efficient termination structure is provided so that it uses the floating capacitor coupled (FCC) trenches in conjunction with the drift region of the active region of the laterally diffuse metal oxide semiconductor (LDMOS) and field-shaping conductors to achieve a breakdown voltage higher than the active region using the minimum area. FIG. 9 includes a source ring region 905, a drain region 915, a termination region 920, an active region 925, an N drift edge region 935, lateral FCC trenches 940 and a drift region 945. The embodiment of FIG. 9 includes lateral FCC trenches 940 at the termination region 920 that are substantially parallel to the lateral FCC trenches 940 in the active region 925. The drift region 945, which is shaded, covers portions of the active region 925 and portions of the termination region 920.

The FCC trenches 940 at the edge of the drain in the termination region 920 can be at least twice as long as the FCC trenches 940 in the active region 925 and can have substantially the same width (i.e. within 10%). The FCC trenches 940 at the edge of the drain in the termination region 920 are substantially parallel to the FCC trenches 940 in the active region 925 and can have some overlap of the active drift region 935. The spacing between the FCC trenches 940 in the termination region 920 can be less than the spacing between FCC trenches 940 in the active area 925. This allows Si in the termination region 920 to be depleted earlier (or at a lower drain bias) than the active region 925, for higher breakdown voltage in the termination region 920. Alternatively, the spacing between the FCC trenches 940 in the termination region 920 can be substantially the same as the spacing between FCC trenches 940 in the active area 925.

Figure 10:
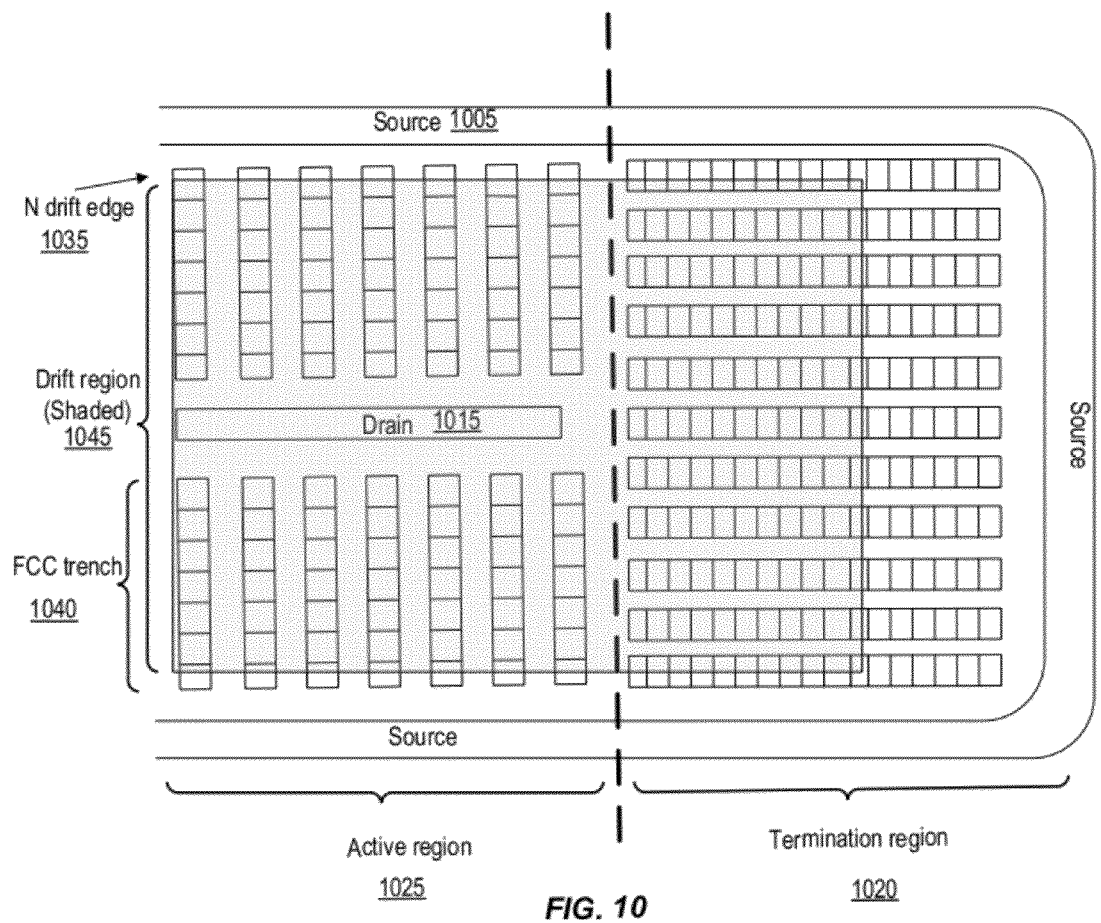
FIG. 10 is a top view of a semiconductor device having lateral floating charge control (FCC) structure with the FCC structures in the termination region perpendicular to the FCC structures in the active region.

FIG. 10 illustrates another embodiment where the FCC trenches at the edge of the drain in the active region are substantially perpendicular to the FCC trenches in the termination region. FIG. 10 includes a source region 1005, a drain region 1015, a termination region 1020, an active region 1025, an N drift edge region 1035, lateral FCC trenches 1040, and a region 1045. The embodiment of FIG. 10 includes lateral FCC trenches 1040 at the termination region 1020 that are substantially perpendicular to the lateral FCC trenches 1040 in the active region 1025. The FCC trenches 1040 at the edge of the drain in the termination region 1020 can be at least twice as long as the FCC trenches 1040 in the active region 1025 and can have substantially the same width (i.e. within 10%). The drift region 1045, which is shaded, covers portions of the active region 1025 and portions of the termination region 1020. The FCC trenches 1040 at the edge of the drain in the termination region 1020 are substantially perpendicular to the FCC trenches 1040 in the active region 1025 and can have some overlap of the active drift region 1035. The spacing between the FCC trenches 1040 in the termination region 1020 can be less than the spacing between FCC trenches 1040 in the active region 1025. Alternatively, the spacing between the FCC trenches 1040 in the termination region 1020 can be substantially the same as the spacing between FCC trenches 1040 in the active region 1025.

According to the embodiments illustrated in FIGS. 9 and 10, the formation of the termination region 920 and 1020 do not add any process steps. Also, the termination regions 920 and 1020 have the same structure and the same material as the active regions 925 and 1025, respectively, which further reduces processing steps.

According to embodiments, a method of manufacturing the semiconductor devices described above include forming a first trench in an area of a semiconductor substrate, forming a first dielectric layer by a combined growth/deposition process, wherein the first dielectric layer lines the first trench, depositing a first conductive material to substantially fill the trench, forming a second trench in the first conductive material, forming a second dielectric layer that lines the second trench, and depositing a second conductive material to substantially fill the second trench. The second trench in the first conductive material is formed by patterning a photolithography layer that has been deposited over the wafer for etching a trench only in the conductive material. The second dielectric layer that lines the second trench is formed by growing the second dielectric layer in the second trench and/or depositing the second dielectric layer in the second trench. The first conductive material and the second conductive material are the field-shaping conductors that are separated by the second dielectric material. The first conductive material and the second conductive material can be electrically isolated to form a first field-shaping conductor and a second field-shaping conductor that are floating. Alternatively, the first conductive material and the second conductive material can be electrically connected to a third field-shaping conductor to form a first field-shaping conductor and a second field-shaping conductor that are biased.

Another method for making capacitively coupled devices and ICs is provided. The first part of the process of establishing the lateral floating capacitively coupled (FCC) structure is to form a trench into the silicon substrate, typically on the order of 1.2 to 1.6 μm hard mask opening. The trench can be made by etching, for example. The masking process could be with photoresist or thick oxide. In one embodiment, one width of the mask opening is used. After the trench is etched in the silicon according to the mask, an oxide is grown to a predetermined thickness that is can be approximately 0.5 μm. This oxide growth process uses about 40% of the silicon sidewall and converts the silicon sidewall into an oxide layer. The rest of the oxide is grown inwards towards the trench center. A polysilicon layer is then deposited into the trench. Next, a second etch process is performed creating another trench inside the first trench and such the second trench features are substantially perpendicular to the orientation of the first trench. One or more perpendicular second trenches are formed inside the first trench. This second trench pattern, which is perpendicular to the first trench pattern, defines a second trench whose body is poly silicon and whose sides are defined by the sidewalls (oxide layer) grown in the first trench sidewall on one side and the polysilicon layer within the first trench on the other side. Such a pattern layout is efficient for processing because the oxide layer of the first trench acts as the masking layer for any trench etching since the selectivity of the polysilicon etch to the oxide etch on typical trench etchers is high (more than ten to one).

Although specific embodiments of the invention have been described, various modifications, alterations, alternative constructions, and equivalents are also encompassed within the scope of the invention. The described invention is not restricted to operation within certain specific embodiments, but is free to operate within other embodiments configurations as it should be apparent to those skilled in the art that the scope of the present invention is not limited to the described series of transactions and steps.

The specification and drawings are, accordingly, to be regarded in an illustrative rather than a restrictive sense. It will, however, be evident that additions, subtractions, deletions, and other modifications and changes may be made thereunto without departing from the broader spirit and scope of the invention as set forth in the claim.

What is claimed is:

1. A semiconductor device comprising:
a source region;
a drain region;
a gate region; and
a drift region comprising:
an active drift region that conducts current between the source region and the drain region when voltage is applied to the gate region; and
a plurality of inactive floating charge control (FCC) regions that field-shape the active drift region to improve breakdown voltage;
wherein the plurality of inactive FCC regions are vertically stacked in the drift region and are separated by the active drift region.

2. The semiconductor device of claim 1 wherein the inactive FCC regions further comprise a plurality of floating field-shaping conductors spreading an applied voltage substantially evenly across a length of the drift region.

3. The semiconductor device of claim 1 wherein the inactive FCC regions further comprise at least one trench having a single field-shaping conductor comprising polysilicon surrounded by an oxide layer.

4. The semiconductor device of claim 1 wherein the inactive FCC regions further comprise at least one trench having more than one field-shaping conductor comprising polysilicon surrounded by an oxide layer.

5. The semiconductor device of claim 3 wherein the field-shaping conductor forms an equipotential around a width of the drift region from the source region to drain region at each of the inactive FCC regions.

6. The semiconductor device of claim 1 wherein the drift region further comprises a second plurality of inactive FCC regions that are vertically stacked in the drift region and are separated by the active drift region and form a mesh structure separating an array of drift region current conduction paths.

7. A semiconductor device comprising:
a source region;
a drain region;
a gate region; and
a drift region comprising:
an active drift region that conducts current between the source region and the drain region when voltage is applied to the gate region; and
a plurality of inactive floating charge control (FCC) regions that field-shape the active drift region to improve breakdown voltage;
wherein the active drift region has a heavily doped portion that is closest to the gate region; and wherein the heavily doped portion that is closest to the gate region is divided into segments roughly aligned with the inactive FCC regions and also overlapping laterally with the active drift region.

8. A semiconductor device comprising:
a source;
a drain;
a gate;
a drift region disposed between the gate and the drain which provides a conduction path between the source and the drain;
a first floating coupled capacitor (FCC) and a second FCC disposed in the drift region between the gate and the drain;
wherein a portion of the drift region between the first FCC and the second FCC comprises at least one pn junction, the pn junction formed by the drift region and a P-resurf layer;
wherein the P-resurf layer is electrically coupled to ground.

9. The semiconductor device of claim 8 wherein the at least one pn junction is a vertical pn junction.

10. The semiconductor device of claim 8 wherein the at least one pn junction increases a carrier concentration in the drift region by about a factor of two.

11. The semiconductor device of claim 8 wherein the at least one pn junction substantially reduces on-resistance of the semiconductor device.

12. A semiconductor device comprising:
a source;
a drain;
a gate;
a drift region disposed between the source and the drain which provides a conduction path between the source and the drain;
a plurality of floating coupled capacitors (FCC) formed in a plurality of floating trench regions disposed in the drift region between the source and the drain, the floating trench regions separated from each other by separation regions;
wherein there is an inverse relation between doping concentration and width of the separation regions.

13. A semiconductor device comprising:
a source;
a drain;
a gate;
a plurality of drift regions having different doping concentrations disposed between the source and the drain;
a plurality of floating coupled capacitors (FCC) formed in a plurality of floating trench regions separating the plurality of drift regions by a plurality of separation regions;
wherein there is an inverse relation between doping concentration and width of the separation regions.

14. The semiconductor device of claim 13 wherein the plurality of drift regions having different doping concentrations comprise a lightest doped region that is closest to the source.

15. The semiconductor device of claim 13 wherein the plurality of drift regions having different doping concentrations comprise a highest doped region that is closest to the drain.

16. The semiconductor device of claim 13 wherein the plurality of drift regions having different doping concentrations comprise:
a lightest doped region that is closest to the source; and
a highest doped region that is closest to the drain.

17. The semiconductor device of claim 13 wherein the plurality of drift regions having different doping concentrations are disposed according to doping concentration with lighter doped regions disposed closest to the source so that a lightest doped region is disposed closest to the source and a highest doped region is disposed closest to the drain.

18. The semiconductor device of claim 13 wherein the plurality of floating trench regions have varying depths.

19. The semiconductor device of claim 13 wherein the plurality of floating trench regions have varying widths.

20. The semiconductor device of claim 13 wherein the plurality of floating trench regions are substantially a same shape.

21. The semiconductor device of claim 13 further comprising a termination region having regions of different doping concentrations wherein the doping concentrations of the termination region are lower than the different doping concentrations in the plurality of drift regions.

22. The semiconductor device of claim 21 wherein the termination region further comprises termination floating trench regions that are wider than the floating trench regions.

* * * * *